US006555221B1

(12) United States Patent
Komiyama et al.

(10) Patent No.: US 6,555,221 B1
(45) Date of Patent: Apr. 29, 2003

(54) METHOD FOR FORMING AN ULTRA MICROPARTICLE-STRUCTURE

(75) Inventors: Hiroshi Komiyama, Tokyo (JP); Hiroaki Shirakawa, Tokyo (JP); Toshio Osawa, Tokyo (JP)

(73) Assignee: The University of Tokyo, Tokyo (JP)

( * ) Notice: Subject to any disclaimer, the term of this patent is extended or adjusted under 35 U.S.C. 154(b) by 0 days.

(21) Appl. No.: 09/425,950

(22) Filed: Oct. 25, 1999

(30) Foreign Application Priority Data

Oct. 26, 1998 (JP) .......................................... 10-303944

(51) Int. Cl.$^7$ ................................................ B32B 5/16
(52) U.S. Cl. .................. 428/402; 428/404; 204/192.11; 204/192.15; 204/192.2; 204/192.22; 204/192.24; 204/192.25
(58) Field of Search ................................ 428/402, 404; 204/192.11, 192.25, 192.24, 192.22, 192.2, 192.15

(56) References Cited

PUBLICATIONS

Shirakawa et al., Migration, coolescence . . . J.N.R. 1999, vol. 1, No. 1, pp. 17–30, Jan. 1999.*
Hirasawa et al. "Growth Mechanism . . . "J. Appl. Phys 82 (3), Aug. 1997.*
Hirasawa et al. "Synthesis of GaAs . . . "Applied Physics Letters, Dec. 1995.*
Stella "Self Organized Growth . . . "Thin Solid Films 318, 73–75, Apr. 1998.*
European Search Report dated Jan. 28, 2000.
Hirasawa et al., "Growth mechanism of nanoparticles prepared by radio frequency sputtering" Journal of Applied Physics, Aug. 1, 1997, AIP, USA, vol. 82, No. 3, pp. 1404–1407.
Shirakawa et al., "Migration–coalescence of nanoparticles during deposition of Au, Ag, Cu, and GaAs on amorphous SiO/sub 2/", Journal of Nanoparticle Research, 1999, Kluwer Academic Publishers, Netherlands, vol. 1, No. 1, pp. 17–30.
Kofman et al., "Self organized growth and ultrafast electron dynamics of metallic nanoparticles" Thin Solid Films, CH, Elsevier–Sequola S.A. Lausanne, vol. 318, No. 1–2, pp. 73–75, 1999.
Nasu et al., "Preparation and optical properties of semiconductor microcrystal–doped Si02 glass thin films by rf–sputtering" Journal of Non–Crystalline Solids, NL, North–Holland Physics Publishing, Amsterdam, vol. 178, pp. 148–154, 1994.
Stella et al., "Raman versus interband absorption in Ge quantum dots", Thin Solid films, CH, Elsevier–Sequoia S.A. Lausanne, vol. 318, No. 1–2, p. 100–102, 1998.
Hirasawa et al., "Synthesis of GaAs nanoparticles by digital radio frequency sputtering" Applied Physics Letters, Dec. 4, 1995, USA, vol. 67, No. 23, pp. 3483–3485.

* cited by examiner

*Primary Examiner*—Leszek Kiliman
(74) *Attorney, Agent, or Firm*—Stevens, Davis, Miller & Mosher, LLP

(57) ABSTRACT

A method for forming an ultra microparticle-structure composed of ultra microparticles including the steps of:

forming on a substrate higher wettability parts and lower wettability parts to a material to be deposited, depositing on the substrate the material to be deposited to form particles made of the material on the substrate, and accumulating the particles in the higher wettability parts to form the ultra microparticle-structure composed of the ultra microparticles.

20 Claims, 4 Drawing Sheets

METHOD FOR FORMING AN ULTRA MICROPARTICLE-STRUCTURE

BACKGROUND OF THE INVENTION

1. Field of the Invention

This invention relates a method for forming an ultra microparticle-structure, and more particularly the same method suitable for forming quantum well wires and quantum well dots in semiconductor-micro processing techniques.

2. Description of Related Art

Recently, semiconductor-micro processing techniques are rapidly developed and large-scale integrations (LSIs) having dimensions of 300 nm have been realized.

On the other hand, when electrons are confined within a very small area having a dimension of several ten nm in a semiconductor, the quantum nature of electron become conspicuous. Thus, taking advantage of the nature, a new functional device such as an electron interference wave element or a single electron element which operates each electron will be realized.

Moreover, if a low-dimensional quantum structure such as quantum well wires or quantum well dots is applied for an active layer of a semiconductor laser, for example, it is theoretically predicted that the characteristics of the laser are remarkably enhanced, compared with a conventional semiconductor laser.

Thus, it is strongly desired to realize nm-scale processing techniques in a field of semiconductor-micro processing technique.

For pursuing the above object, in forming semiconductor-quantum well wires or quantum well dots, for example, a method has been developed that a quantum well structure is formed through crystal growth on a wafer, which is processed in strip and rectangle by lithography and etching, and the side walls of the processed wafer are embedded by secondary crystal growth.

Similarly, in forming a low-dimensional quantum structure such as semiconductor-quantum well wires or quantum well dots, developed is such a method using a crystal-growing technique as: ① a method that a strip structure is formed by using a step flow mode to grow a crystal in a transverse direction from an atomic face-step in slightly slipped surface (slightly inclined face) to the low index face of the crystal, ② a method that, after a three-dimensional structure with small faces called as "facet" is selectively formed in openings of a substrate partially covered with amorphous film, on a part of the three-dimensional structure is formed a quantum well wire- or a quantum well dot-structure, the upper surface of which is covered with another semiconductor crystalline film, ③ a method that, in crystal-growing on a substrate of which surface is processed in concave-convex shape, a quantum well wire- or a quantum well dot-structure is formed on the given position of the substrate by using different crystal growth rate and is covered with another semiconductor crystalline film, ④ a method that a quantum well dots are formed of itself using distortion between heterojunction with different lattice constant, without specific processing of crystalline underlayer.

However, the former method using the crystal processing of lithography restricts a lateral confining size and brings about defects in a re-growing boundary.

Moreover, the latter method using the crystal growth technique degrades reproducibly through a step bunching phenomena or a step ordering phenomena.

Furthermore, both of the methods can miniaturize the quantum well wires or quantum well dots only up to several ten nm-scale and can not provide the ones with ideal scale of several nm.

SUMMARY OF THE INVENTION

It is an object of the present invention to provide a method for forming an ultra microparticle-structure composed of ultra microparticles of several nm-scale.

This invention relates to a method for forming an ultra microparticle-structure composed of ultra microparticles comprising the steps of:

forming on a substrate higher wettability parts and lower wettability parts to a material to be deposited, depositing on the substrate the material to be deposited to form particles made of the material on the substrate, and accumulating the particles in the higher wettability parts to form the ultra microparticle-structure composed of the ultra microparticles.

FIG. 1 is a general view for explaining a method for forming an ultra microparticle-structure according to the present invention.

First of all, as shown in FIG. 1(a), for example, a film 2 made of an energically unstable material to a material to be deposited is formed on a substrate 1 to lower the wettability of the whole surface of the substrate 1 to the material to be deposited.

Next, as shown in FIG. 1(b), openings 3 are formed on the surface of the substrate 1 to form thereon higher wettability parts to the material to be deposited.

Thereafter, a target made of the material to be deposited is sputtered and particles 4 made of the material are deposited on the substrate 1 at a deposition rate of 0.01–10 nm/sec.

Just then, the surface of the substrate 1 has lower wettability parts to the particles 4 due to the film 2 formed thereon. Thus, as soon as the particles 4 are deposited on the substrate 1 (surfaces 2A of the film2), they immediately migrate on the surface (the surfaces 2A of the film2) of the substrate 1. Then, when they come at the openings 3 having higher wettability thereto, they fall into the openings to be energetically stable. Therefore, the particles 4 are accumulated in the openings 3 and, lastly, as shown in FIG. 1(d), they collide and coalesce one another to form ultra microparticles 5.

In this case, a part of the particles 4 may melt at its collision. Such a melting can make the ultra microparticles 5 substantially sphere.

The sizes of the ultra microparticles 5 formed as above-mentioned are determined within the sizes of the openings 3 having higher wettabilities to the material to be deposited. Moreover, they can be freely controlled within the sizes of the openings 3 by adjusting an amount of the particles 4 to be deposited and changing the migration degree of the particles 4.

Therefore, the ultra microparticle-structure composed of ultra microparticles of several nm-scale is easily formed, which is an object of the present invention.

FIGS. 2 to 4 are TEM photographs showing an ultra microparticle-structure formed by the forming method of an ultra microparticle-structure according to the present invention.

FIGS. 2 to 4 show ultra microparticle-structures in which particles made of Au are deposited onto a substrate made of amorphous $SiO_2$, respectively.

FIGS. 2(a) and (b) show ultra microparticle-structures formed on a substrate kept at room temperature, and FIGS.

3 and 4 show ultra microparticle-structures formed on a substrate kept at 500° C.

FIGS. 2(a) and (b) show ultra microparticle-structures formed by depositing the particles for 20 seconds and 60 seconds, respectively. Moreover, FIG. 4 shows an ultra microparticle-structure formed by embedding openings with the same amorphous $SiO_2$ as material composing the substrate after depositing the particles as shown in FIG. 3.

Since these TEM photographs are taken at 400,000 times, from measuring the each size of the particles in the photographs, it has a size of about 2–4 nm, respectively which is very fine. That is, the ultra microparticle-structure formed by the forming method of an ultra microparticle-structure of the present invention has ultra microparticles of nm-scale.

Thus, since the ultra microparticle-structure has particles with ideal sizes for the quantum well wires and the quantum well dots, it is expected for realizing ones with nm-scale.

BRIEF DESCRIPTION OF THE DRAWINGS

The invention will be more particularly described with reference to the accompanying drawings.

DESCRIPTION OF THE PREFERRED EMBODIMENTS

Figure 1A:
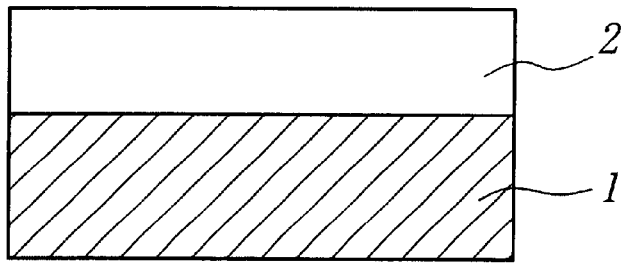
FIGS. 1(a) to (d) are general views for explaining the method for forming an ultra microparticle-structure according to the present invention, FIGS. 2(a) and (b) are TEM photographs of an example of an ultra microparticle-structure formed by the forming method according to the present invention.
Figure 1B:
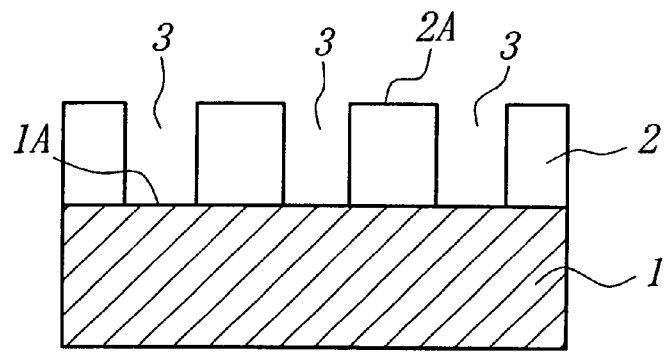
Figure 1C:
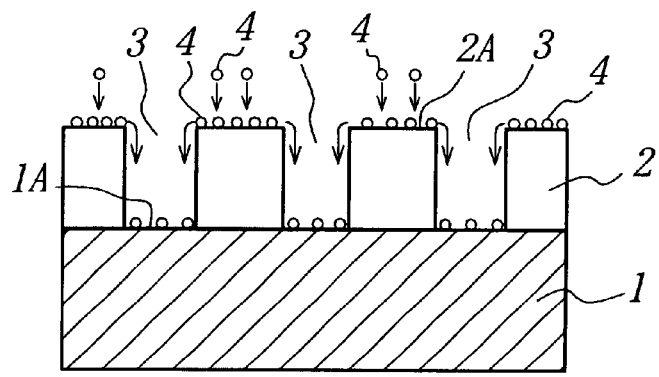

The invention will be described in detail as follows, with reference to the above drawings.

FIGS. 1(a) to (d) are general views for explaining the forming method of an ultra microparticle-structure according to the present invention, as above-mentioned.

In the forming method of an ultra microparticle-structure, higher and lower wettability parts to a material to be deposited are needed to be formed on a surface of a substrate 1.

In the case of forming only the lower wettability parts to the material on the surface of the substrate 1, when particles 4 made of the material to be deposited come flying on the surface, they does not accumulate thereon not to form ultra microparticles 5.

In the case of forming only the higher wettability parts to the material on the surface of the substrate 1, when particles 4 made of the material to be deposited come flying on the surface, they become energetically stable without sufficient migration. Thus, as is the case with forming only the lower wettability parts, the particles 4 does not accumulate to form the ultra microparticles 5.

The low wettability parts can be formed on the surface of the substrate 1 by forming a film 2 made of an lower wettability material to the material to be deposited on the surface through evaporation, sputtering, CVD, MBE, MOVPE, etc. Moreover, the parts may be formed through ion platting, laser abrasion. Furthermore, the part may be formed by making the substrate 1 itself of the lower wettability material.

The high wettability parts can be formed on the surface of the substrate 1 by forming openings 3 in the film 2 made of an lower wettability material to a material to be deposited or in the substrate, as above-mentioned. In, addition, they may be formed through ion-irradiation, electron beam-irradiation or ultraviolet-irradiation to the surface of the substrate. Moreover, they may be formed by applying a solution, radical treatment, plasma treatment, partially heating of infrared laser, or plating.

The openings 3 may be formed through plasma etching, vapor phase reaction, or liquid phase reaction to the surface of the film 2 or the substrate 1.

Each size of the openings 3 is determined, depending upon the each size of the ultra microparticles to be formed. For forming nm-scaled ultra microparticles easily, it is preferably 0.5–100 nm, particularly 3–30 nm.

The material to be deposited may be deposited onto the substrate by a sputtering method, an evaporation method, a CVD method, a MBE method, or a MOVPE method. These methods may be selected in accordance with the sort of the material or the other objects.

The sputtering method may be preferably employed for the deposition because it can easily control its deposition rate. In this case, by setting the deposition rate over 1 nm/sec, the particles 4 made of the material is likely to melt. Consequently, the ultra microparticles 5 with very perispherical shape may be formed.

For example, in the case of constituting of the openings 3 the higher wettability parts to the material to be deposited on the surface of the substrate, as above-mentioned, each size of the ultra microparticles 5 can be controlled within each size of the openings 3 by appropriately adjusting the amount of the particles 4 made of the material to be deposited or adjusting the migrating amount of the particles 4 up to the openings 3.

The amount of particles 4 may be controlled by adjusting a sputtering rate in sputtering the material to be deposited, for example. In the case of employing another deposition method, it may be controlled by changing an evaporation rate or a reaction time of the material.

Moreover, it may be controlled by intervening a mesh between a source such as a target and the substrate or making a target of amorphous material.

The migrating amount of the particles 4 up to the openings 3 with high wettability may be controlled by changing the deposition rate of the material to be deposited as above-mentioned or changing the energies of the particles 4 via the change of the substrate temperature, that is, the kinetic energies of the particles 4 on the substrate.

Moreover, it may be controlled by adjusting the wettability of the surface of the substrate and adjusting the flatness of the substrate.

Figure 2:
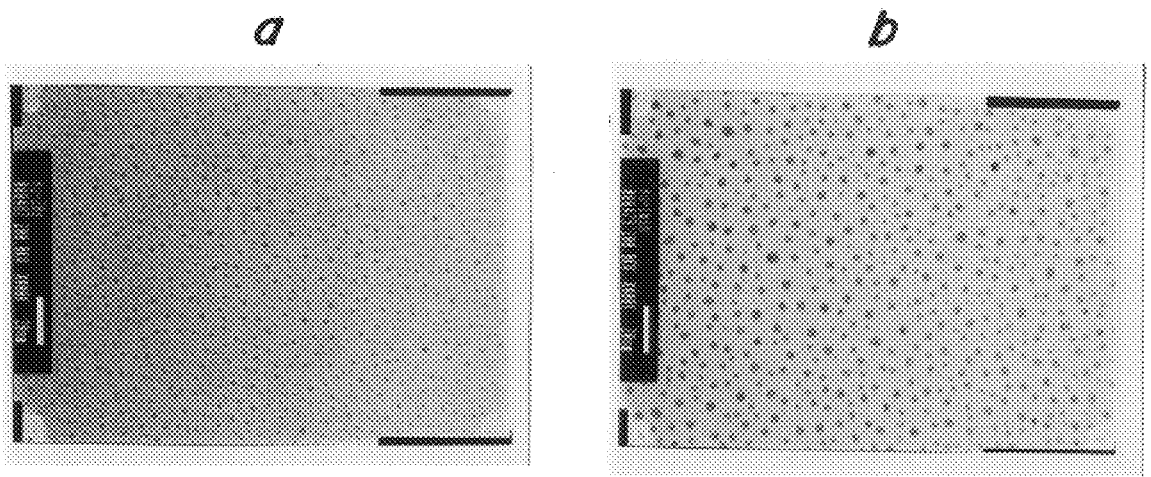

The particles 4 migrate on the surface of the substrate, that is, on a surface 2A of the film 2 in FIG. 2, and collide and coalesce one another on the surface 2A and a surface 1A of the substrate 1 inside the openings 3 to increase their sizes.

Thus, the embedding of the openings 3 on the substrate 1 prevents the particles 4 from falling into the openings. The covering of the particles 4 prevents the particles from colliding and coalescing one another. Consequently, the embedding and the covering prevent the sizes of the particles 4 from being increased.

A material to embed the openings 3 or cover the particles 4 is not restricted, and any kind of material may be employed for its embedding or its covering. For forming the ultra microparticle-structure uniting the substrate as shown in FIGS. 1(a) to (d), it is desirable to use the same material as one for the film 2 or the substrate 1.

Figure 1D:
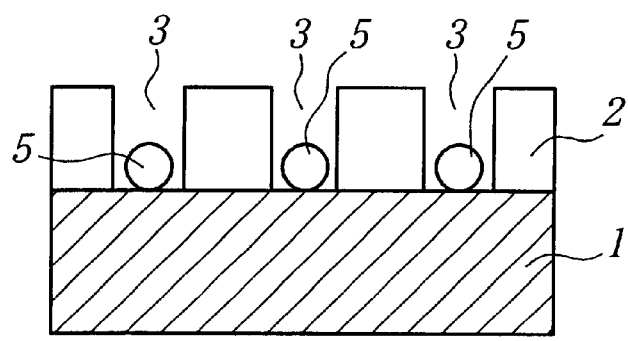

For example, the above-obtained nano-particle-structure has nano-particles 5 as shown in FIG. 1(d) whose spherical diameter is between 0.5 nm to 100 nm, preferably 3 nm to 30 nm via controlling migration-degrees.

EXAMPLES

This invention is concretely described on the examples, with reference to the drawings.

Example 1

In this example, the substrate 1 itself was made of a material having a lower wettability to the material to be deposited, without forming the film 2 as shown in FIG. 1. That is, the material to be deposited was composed of Au material, and the material having the lower wettability was composed of amorphous $SiO_2$ material. Then, the substrate 1 was composed of a Cu-mesh and a layer made of the amorphous $SiO_2$ formed on the Cu-mesh by sputtering.

The material to be deposited was deposited, at a deposition rate of 0.016 nm/sec by sputtering, on the substrate 1 kept at room temperature.

When ultra microparticle-structures formed at deposition-times of 20 seconds and 60 seconds were observed by a TEM, respectively, the ultra microparticle-structures turned out to have structures shown in FIGS. 2(a) and (b).

When the average size of the ultra microparticles constituting the ultra microparticle-structures were measured from the 400,000 times-TEM photographs shown in FIGS. 2(a) and (b), they were 2.10 nm and 3.64 nm in the 20 seconds-deposition time in FIG. 2(a) and the 60 seconds-deposition time in FIG. 2(b), respectively.

Example 2

Figure 3:
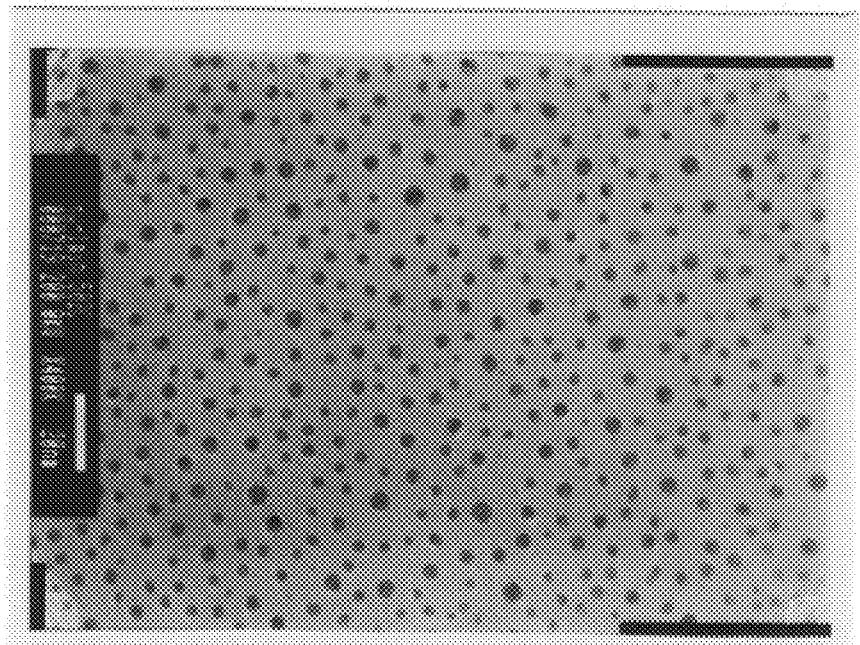
FIG. 3 is a TEM photograph of another example of an ultra microparticle-structure formed by the forming method according to the present invention.

Except that the temperature of the substrate was 500° C. and the deposition time was 60 seconds, an ultra microparticle-structure was formed as in Example 1. When the thus obtained ultra microparticle-structure was observed by a TEM, it turned out to have a structure as shown in FIG. 3.

When the average size of the ultra microparticles constituting the ultra microparticle-structure was measured as in Example 1, it was 3.37 nm.

Example 3

An ultra microparticle-structure was formed as in Example 2 and was held on the substrate 1 kept at 500° C. for 2 hours.

Figure 4:
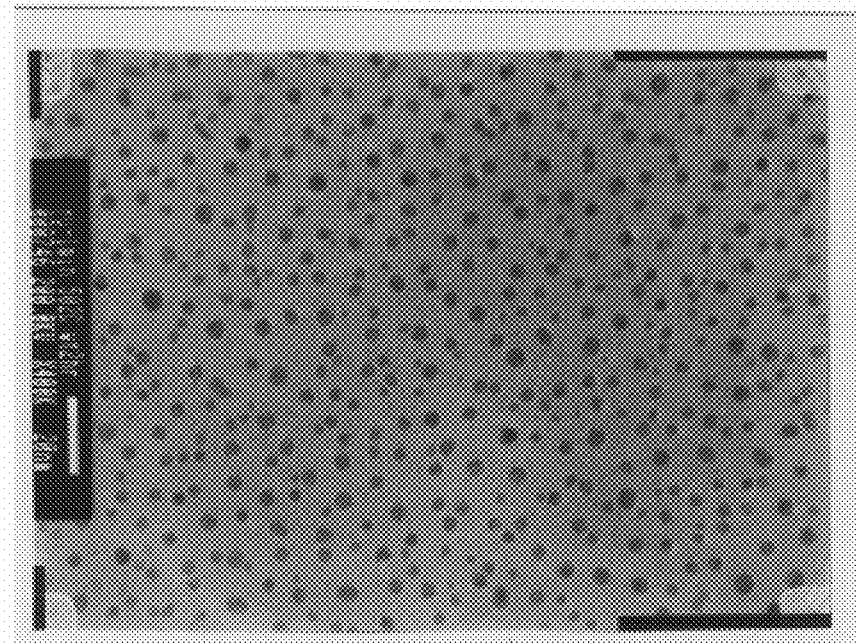
FIG. 4 is a TEM photograph of further example of an ultra microparticle-structure formed by the forming method according to the present invention.

The thus obtained ultra microparticle-structure was observed by a TEM, it turned out to have a structure as shown in FIG. 4.

When the average size of the ultra microparticle-structure constituting the ultra microparticle-structure was observed by the same manner as in the above examples, it turned out to be 3.64 nm.

Example 4

Figure 5:
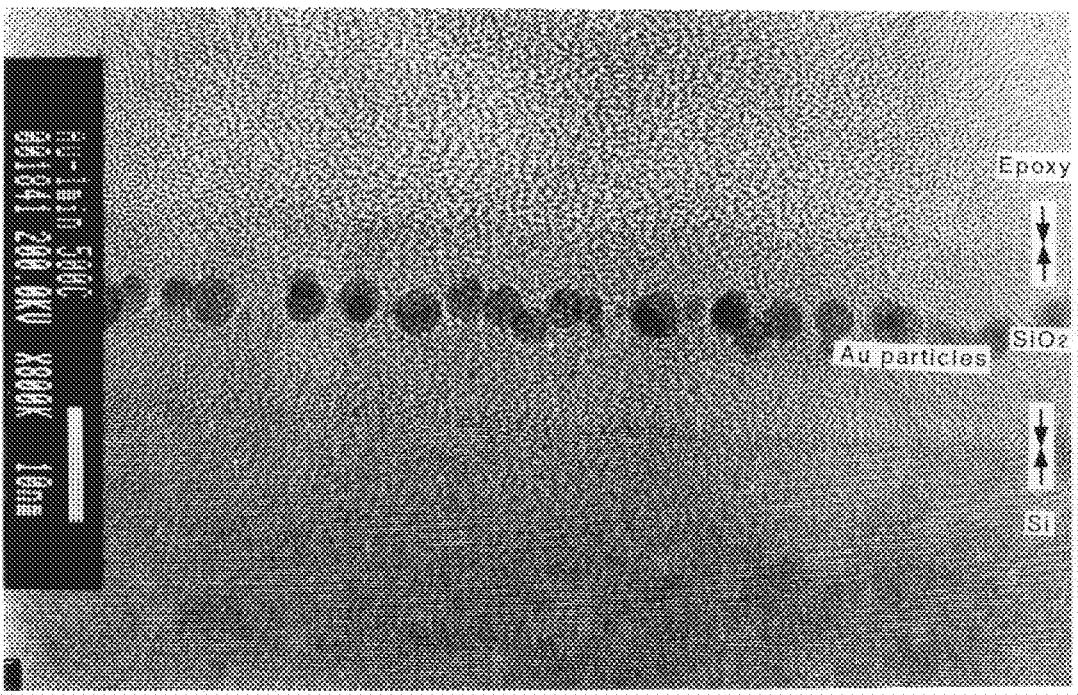
FIG. 5 is a TEM photograph showing a growing process of ultra microparticles constituting an ultra microparticle-structure according to the present invention.

In this example, an ultra microparticle-structure was formed as in Example 2. After the ultra microparticles constituting the ultra microparticle-structure were covered with the same amorphous $SiO_2$ material as the substrate 1, the ultra microparticle-structure was observed at a cross section perpendicular to the surface of the substrate 1. Consequently, it turned out to have a structure, at the cross section, as shown in FIG. 5.

As is apparent from Examples 1 to 3, according to the forming method of an ultra microparticle-structure of the present invention, the ultra microparticle-structure composed of the ultra microparticles with several nm-scale can be formed.

Moreover, when the deposition time of the material to be deposited is increased in Example 1 or the substrate temperature is increased in Example 2, the sizes of the ultra microparticles constituting the ultra microparticle-structure are increased.

From the fact that the ultra microparticles are uniformly dispersed in Example 2, on the contrary, they are randomly dispersed in Example 3, it is turned out that they migrate during the two hours. Moreover, as is apparent from the TEM photograph in Example 4, the ultra microparticles, constituting the ultra microparticle-structure formed by the forming method of the present invention, are almost spherical.

As above-mentioned, amorphous $SiO_2$ material is employed as the lower wettability material and Au material is employed as the material to be deposited in the examples. Then, the substrate is composed of the layer made of the amorphous $SiO_2$. However, the present invention may be applied not only for these material, but also for any kind of material.

For example, as the material to be deposited may be used Si, GaAs, InP, GaN, ZnS, ZnO, AlN, $Al_2O_3$, $TiO_2$, $PbTiO_3$, W, Ag, Cu, $CuCl_2$, CdS, PbS, a compound of these material, etc., in addition to the above Au.

Moreover, as the lower wettability material constituting the substrate may be used Si, amorphous Si, amorphous $SiH_x$, $Si_3N_4$, amorphous SiN, $Al_2O_3$, $CaF_2$, NaCl, TiN, SiC, GaAs, AlN, Zn, $TiO_2$, graphite, diamond, etc., besides the above amorphous $SiO_2$.

Furthermore, in forming the film 2 as shown in FIG. 1, a lower wettability material to the material to be deposited is selected from among the above exemplifying materials in and the film 2 is formed form the selected material by sputtering.

Although the present invention was described in detail with reference to the above examples, this invention is not limited to the above disclosure and every kind of variation and modification may be made without departing from the scope of the present invention.

As above-mentioned, according to the present invention, an ultra microparticle-structure composed of ultra microparticles with several nm-scale can be easily formed. As a result, a quantum well wires or quantum well dots having a low-dimensional quantum structure may be formed in an ideal size. Moreover, a device having new functions such as single electronic element can be also formed.

Furthermore, VLSIs can be much miniaturized according to the present invention.

What is claimed is:

1. A method for forming a nano-particle-structure composed of nano-particles comprising the steps of:

forming on a substrate higher wettability parts and lower wettability parts to a material to be deposited;

depositing said material on the substrate to form particles of said material thereon; and accumulating the particles in the higher wettability parts to form the nano-particle-structure composed of the nano-particles.

2. A method for forming a nano-particle-structure as defined in claim 1, wherein the higher wettability parts are composed of openings formed on a surface of the substrate.

3. A method for forming a nano-particle-structure as defined in claim 1 or 2, wherein the material to be deposited is deposited by sputtering.

4. A method for forming a nano-particle-structure as defined in claim 3, wherein the deposition rate of the material to be deposited is 0.01 nm/sec to 10 nm/sec.

5. A method for forming a nano-particle-structure as defined in claim 1 or 2, wherein the sizes of the nano-particles constituting the nano-particle-structure are controlled by adjusting the amount of the material to be deposited.

6. A method for forming a nano-particle-structure as defined in claim 5, wherein the amount of the material to be deposited is controlled by adjusting the deposition rate of the material.

7. A method for forming a nano-particle-structure as defined in claim 1 or 2, wherein the sizes of the nano-particles constituting the nano-particle-structure are controlled by adjusting the temperature of the substrate.

8. A method for forming a nano-particle-structure as defined in claim 1 or 2, wherein the sizes of the nano-particles constituting the nano-particle-structure are increased by collision and coalescing of the particles made of the material to be deposited via their migration on the substrate.

9. A method for forming a nano-particle-structure as defined in claim 2, further comprising the steps of:

embedding the openings formed on the surface of the substrate after depositing the material to be deposited on the substrate; and covering the nano-particles, whereby the sizes of the nano-particles constituting the nano-particle-structure are halted from being increased.

10. A method for forming a nano-particle-structure as defined in claim 1 or 2, wherein the wettability of the surface of the substrate is lowered by directly covering the surface with a lower wettability material to the material to be deposited.

11. The method of claim 1, wherein said nano-particles have diameters in a range of 0.5 nm to 100 nm.

12. The method of claim 2, wherein said nano-particles have diameters in a range of 0.5 nm to 100 nm.

13. The method of claim 3, wherein said nano-particles have diameters in a range of 0.5 nm to 100 nm.

14. The method of claim 4, wherein said nano-particles have diameters in a range of 0.5 nm to 100 nm.

15. The method of claim 5, wherein said nano-particles have diameters in a range of 0.5 nm to 100 nm.

16. The method of claim 6, wherein said nano-particles have diameters in a range of 0.5 nm to 100 nm.

17. The method of claim 7, wherein said nano-particles have diameters in a range of 0.5 nm to 100 mm.

18. The method of claim 8, wherein said nano-particles have diameters in a range of 0.5 nm to 100 nm.

19. The method of claim 9, wherein said nano-particles have diameters in a range of 0.5 nm to 100 mm.

20. The method of claim 10, wherein said nano-particles have diameters in a range of 0.5 nm to 100 nm.

* * * * *